United States Patent [19]

Leussler

[11] Patent Number: 5,416,413
[45] Date of Patent: May 16, 1995

[54] MAGNETIC RESONANCE EXAMINATION APPARATUS COMPRISING A COIL SYSTEM FOR MR MAMMOGRAPHY

[75] Inventor: Günther C. Leussler, Hamburg, Germany

[73] Assignee: U. S. Philips Corporation, New York, N.Y.

[21] Appl. No.: 91,633

[22] Filed: Jul. 14, 1993

[30] Foreign Application Priority Data

Aug. 13, 1992 [DE] Germany .................. 42 26 814.1

[51] Int. Cl.$^6$ ........................................... G01R 33/32
[52] U.S. Cl. ............................... 324/318; 128/653.5
[58] Field of Search ............... 324/318, 322, 314, 300; 128/653.2, 653.5

[56] References Cited

U.S. PATENT DOCUMENTS

| | | | |
|---|---|---|---|
| 4,816,765 | 3/1989 | Boskamp | 324/322 |
| 4,825,164 | 4/1989 | Requardt | 324/322 |
| 4,839,595 | 6/1989 | Boskamp | 324/318 |
| 4,859,947 | 8/1989 | Boskamp | 324/318 |
| 4,943,775 | 7/1990 | Boskamp et al. | 324/322 |
| 4,973,908 | 11/1990 | Bottomley et al. | 324/318 |
| 5,003,265 | 3/1991 | Leussler | 324/318 |
| 5,216,368 | 6/1993 | Leussler | 324/318 |
| 5,256,971 | 10/1993 | Boskamp | 324/318 |
| 5,317,266 | 5/1994 | Meissner | 324/318 |

FOREIGN PATENT DOCUMENTS

| | | | |
|---|---|---|---|
| 0338624 | 10/1989 | European Pat. Off. | G01N 24/04 |
| 3816831 | 11/1989 | Germany | G01N 24/04 |
| 4332531 | 11/1992 | Japan | 128/653.5 |
| 5237076 | 9/1993 | Japan | 128/653.5 |

OTHER PUBLICATIONS

"Prototyp-Doppelspule fur die Mamma-Mr-Messung" by Kaiser et al, Fortschr. Rontgenstr. 151,1 (1989), pp. 103-105.

*Primary Examiner*—Sandra L. O'Shea
*Assistant Examiner*—Raymond Y. Mah
*Attorney, Agent, or Firm*—Edward Blocker

[57] ABSTRACT

The invention relates to a magnetic resonance examination apparatus, comprising a coil system for MR mammography which has a particularly attractive signal-to-noise ratio. It comprises a first coil system (11) which comprises conductor loops which are merely inductively coupled to one another and which are provided on the surface of a cylinder in parallel planes, one of the loops being connectable to an input (22) of a receiving device (20). It also comprises a second coil system (12, 13) which is constructed as a surface coil and which is arranged at the end face of the first coil system (11) and can be connected to a further input (21) of the receiving device (20).

5 Claims, 2 Drawing Sheets

MAGNETIC RESONANCE EXAMINATION APPARATUS COMPRISING A COIL SYSTEM FOR MR MAMMOGRAPHY

BACKGROUND OF THE INVENTION

1. Field of the Invention

The invention relates to a magnetic resonance examination apparatus comprising a coil system for MR mammography.

2. Description of the Related Art

A coil system of this kind is known from the article "Prototyp-Doppelspule für die Mamma-MR-Messung" by Kaiser et al in Fortschr. Röntgenstr. 151,1 (1989), pp. 103–105. This coil system comprises two conductor loops in parallel planes which can be connected to a receiving device of a magnetic resonance examination apparatus. This coil system serves for the simultaneous examination of both breasts and has a signal-to-noise ratio which is inferior to that of a single coil conceived for the examination of a single breast.

SUMMARY OF THE INVENTION

It is an object of the invention to enhance the signal-to-noise ratio. This object is achieved in that the coil system comprises a combination of a first coil system, comprising a plurality of conductor loops which are merely inductively coupled to one another and which are arranged on the surface of a cylinder in parallel planes, one of said loops being connectable to an input of a receiving device, and a second coil system which is constructed as a surface coil of the butterfly type which is situated at one of the end faces of the first coil system and which can be connected to a further input of the receiving device.

In accordance with the invention, the first and the second coil system are operative together for mammography. An example of the first coil system is described in detail in DE-OS 38 16 831. The second coil system is a surface coil of the butterfly type which is described, for example in EP-OS 338 624. Reference is specifically made to both publications.

The first coil system is capable of detecting RF magnetic fields having a field direction parallel to the cylinder axis, whereas the second coil system, being situated in a plane parallel to the planes of the conductor loops of the first coil system, is capable of detecting RF magnetic fields extending perpendicularly to the cylinder axis.

Therefore, the two RF coil systems together operate as a quadrature coil system having a particularly attractive signal-to-noise ratio.

In a further embodiment of the invention, the opening enclosed by the outer conductors of the second coil system is greater than that enclosed by the individual conductor loops of the first coil system. As a result, the area within the two coil systems for which the best signal-to-noise ratio appears is shifted in the direction of the end face of the first coil system which is situated further from the second coil system, said shift being greater as the ratio of the dimensions of the second coil system to those of the first coil system is greater.

BRIEF DESCRIPTION OF THE DRAWINGS

The invention will be described in detail hereinafter with reference to the drawing. Therein.

DESCRIPTION OF THE PREFERRED EMBODIMENTS

Figure 1:
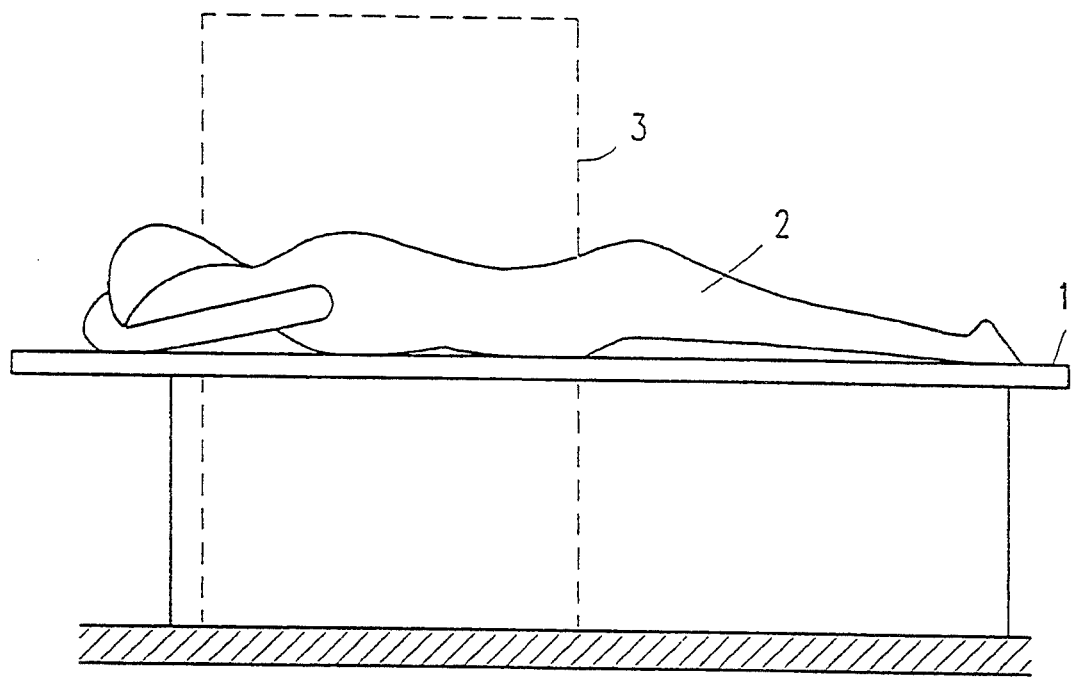
FIG. 1 shows an embodiment of a magnetic resonance examination apparatus in accordance with the invention.

FIG. 1 shows a magnetic resonance examination apparatus, comprising a patient table 1 on which a patient 2 is positioned face down during an examination. The block 3, denoted by dashed lines, comprises a main field magnet which generates a strong, uniform, horizontal magnetic field. It also includes an RF transmitter coil which generates an RF magnetic field perpendicularly to the steady magnetic field in the examination zone, said RF magnetic field having a frequency which depends linearly on the strength of the steady magnetic field. The RF transmitter coil operates in a pulsed manner. The block 3 also includes inter alia gradient coils which are capable of generating, during or after the RF pulses, magnetic gradient fields with gradients acting in different directions.

Figure 2:
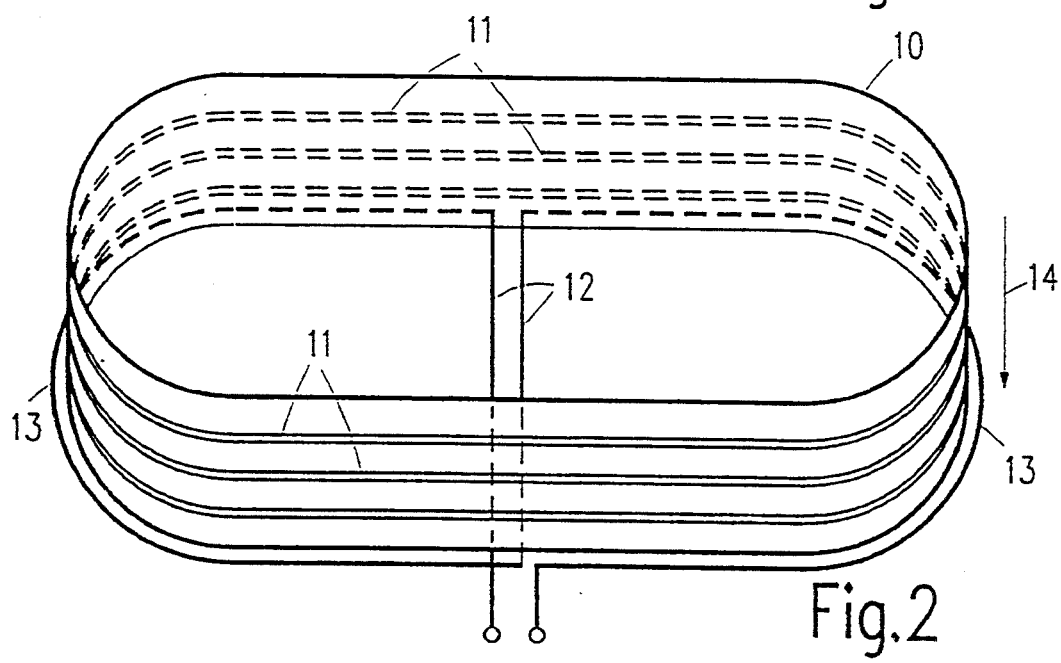
FIG. 2 shows a first embodiment of the coil system.

FIG. 2 shows a coil system suitable for mammography. This coil system comprises a first coil system which comprises conductor loops 11 which are arranged in several parallel planes on a cylindrical support 10 and which are merely inductively coupled to one another, one of said loops being connectable to the input of a receiving device. RF coil systems of this kind are known per se from DE-OS 38 16 831 whereto reference is specifically made.

As has already been stated, the support has a cylindrical shape, i.e. its cross-sections in different cross-sectional planes perpendicular to the cylinder axis are identical. The hollow-cylindrical support, being made of a non-conductive material, preferably a synthetic material, is proportioned so as to be adapted to the anatomy of the patient to be examined, so that the interior of the support can simultaneously accommodate both breasts during an examination. The support may have a height of, for example 6 cm, its walls being flat in the central part of the support and being situated at a distance of, for example 16 cm from one another. The flat walls in the central area are connected to one another on both sides via edge portions having an arched cross-section, resulting in dimensions of 33 cm in the longitudinal direction (i.e. in the horizontal direction in FIG. 2).

FIG. 2 shows merely three conductor loops. Notably at low frequencies, i.e. in magnetic resonance examination apparatus with a weak steady magnetic field, however, a greater number of conductor loops should be provided, for example five. Such an RF coil system is capable of detecting RF magnetic fields extending parallel to the cylinder axis.

In a plane extending directly at the lower end face of the cylindrical support 10 there is provided a second coil system which is constructed as a surface coil and which is capable of detecting RF magnetic fields extending perpendicularly to the cylinder axis. This surface coil may be provided on a supporting plate (not shown). The surface coil is of the so-called butterfly type. Such coils are known per se from EP-OS 338 624 as well as from the publication mentioned therein. Reference is explicitly made thereto. The surface coil comprises two central conductors 12 which extend in parallel and close to one another, said conductors opening into two mirror-inverted identical loop portions which together form a loop whose shape corresponds to one of the conductor loops 11 but whose dimensions are preferably larger. The loop portion whose central conductor is connected to a connection terminal of the coil terminates in the central conductor of the other loop portion which terminates in a further connection terminal of the coil. The current through the two central conductors has the same direction which opposes that of the current through the outer conductor 13. As a result, this coil is capable of detecting RF fields extending perpendicularly to the axis of the cylinder 10 and perpendicularly to the central conductors 12.

Because the RF magnetic fields occurring in a magnetic resonance examination apparatus under the influence of spin resonance always extend perpendicularly to the direction of the uniform, steady magnetic field, the entire coil system 10 . . . 13 must be introduced into the magnetic resonance examination apparatus so that the two magnetic field directions which can be detected by the first and the second coil system extend perpendicularly to the direction of the uniform, steady magnetic field, i.e. during the examination the uniform, steady magnetic field should extend parallel to the central conductors 12 as denoted by the arrow 14. Therefore, the coil system 10 . . . 13 must be positioned accordingly in the magnetic resonance examination apparatus. This could be performed manually by the operator for each examination. It is more advantageous when at least one of the two coil systems is arranged in a defined position by way of a permanent connection to the apparatus or a component which can be introduced therein.

Figure 3:
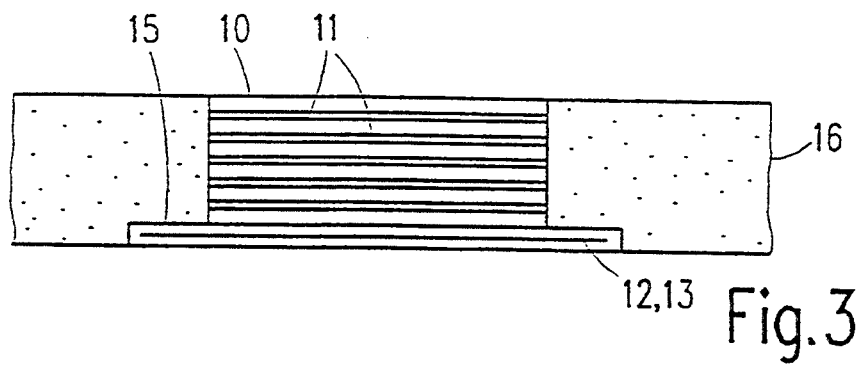
FIG. 3 is a cross-sectional view of a part of the apparatus.

FIG. 3 shows a part of a flat cushion 16 which can be arranged on the patient support 1 and on which the patient is positioned during mammography. The coil system shown in FIG. 2 is embedded in this cushion, the reference numeral 15 denoting the plate supporting the surface coil 12, 13.

The introduction of the cushion into the magnetic resonance examination apparatus reduces the space available for examination. It would be a more attractive solution to mount the RF coil system in the table top of the patient support 1. However, for this solution it is necessary that the two coil systems can be switched off, for example by way of PIN diodes, so that no substantial currents can flow when the RF transmitter coil is activated for other examinations.

It is also possible to connect only one of the two coil systems permanently to the magnetic resonance examination apparatus; for example the surface coil 12, 13 (with a suitable switch-off facility) may be provided on the side of the table top of the support 1 which faces the patient. The coil system 10, 11 should then be arranged thereon and be aligned with respect thereto for mammography.

Figure 4:
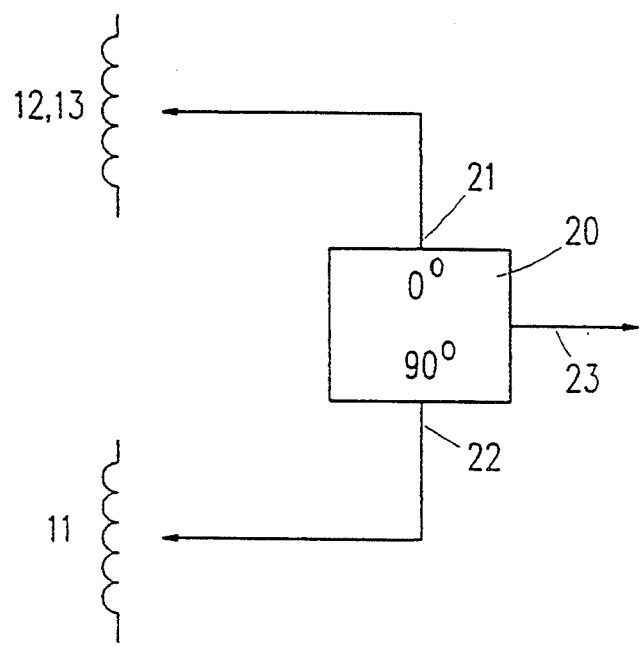
FIG. 4 shows its connection to the receiving device in a magnetic resonance examination apparatus.

As has already been stated, the coil systems 11-12, 13 operate as a quadrature coil. FIG. 4 shows diagrammatically a circuit for processing the signals supplied by the two coil systems. The essential component is formed by a quadrature combination circuit 20 which comprises a first input 21 and a second input 22. The signal at the output 23 of the combination circuit corresponds to the product of the signal at the input 21 and the signal shifted through 90° at the input 22. The surface coil 12, 13 is connected to the input 21 and the coil system comprising the conductor loops 11 is connected to the input 22.

To those skilled in the art it will be evident that the coil systems are tuned to the frequency of the spin resonance signal by means of suitably proportioned capacitances so that they operate as resonators. These capacitances, however, are not shown.

Optimum operation of a quadrature coil system (with an improvement of the signal-to-noise ratio amounting to 3 dB) occurs only for the spatial zones in which the decay of the nuclear magnetization sums equal signals in both coils. The distance between this zone and the plane of the surface coil 12, 13 depends on the dimensions thereof relative to the dimensions of the coil system 11. The zone is situated further from said plane as the dimensions of the surface coil are greater relative to the conductor loops 11. A suitable value is obtained when the dimensions of the surface coil amount to 20 cm, in the direction parallel to the central conductors 12, and 40 cm in the direction perpendicular thereto. The dimensions are approximately 1.25 times the dimensions of the conductor loops 11.

Figure 5:
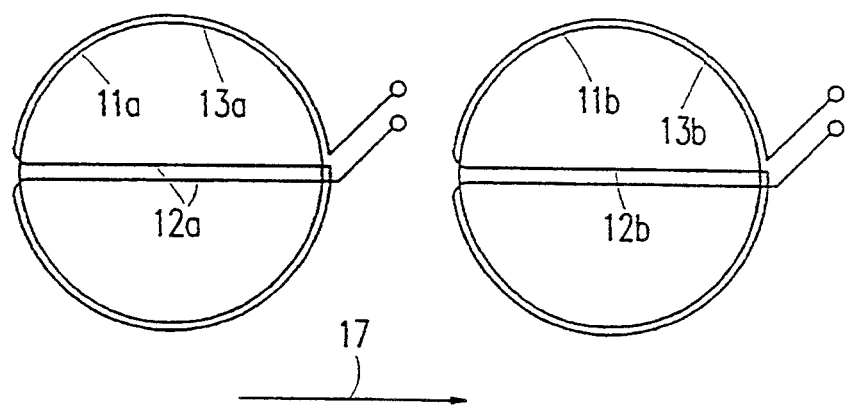
FIG. 5 shows a second embodiment of the coil system.

The advantages of the coil system shown in FIG. 2 become effective only if the uniform, steady magnetic field in the magnetic resonance examination apparatus extends in the longitudinal direction of the table. When it extends in the horizontal direction but perpendicularly to the longitudinal direction of the table, essentially only the first coil system (11) is active, whereas in the case of a vertical direction of the field the coil 11 is unactive. FIG. 5 shows a coil system enabling mammography when the uniform steady magnetic field extends horizontally but perpendicularly to the longitudinal direction of the table. FIG. 5 is a plan view of the coil system, it being clear that it consists of two identical, mutually independent sections. Each section per se enables examination of only a single breast and comprises a coil system 11a, 11b, respectively, which, like the system 11 shown in FIG. 2, comprises several concentric conductor loops 11a, 11b of the same shape and the same size which are arranged in parallel planes, and also comprises respective surface coils 12a, 13a and 12b, 13b, analogous to FIG. 2, whose shape and dimensions are adapted thereto and which are situated in a plane extending parallel to said planes. The operation of this coil system is optimum for the direction of the central conductors 12a, 12b shown in FIG. 5 when the uniform, steady magnetic field extends in the direction of the arrow 17, i.e. perpendicularly to the plane of drawing of FIG. 1.

When the conductor loops 11a, 11b and the outer conductors 13a, 13b, adapted thereto, have the circular shape shown in FIG. 5, these coil systems can also be used in magnetic resonance examination apparatus in which the steady, uniform magnetic field extends in the longitudinal direction of the table. To that end, the two coil systems need merely be rotated through each time 90°. The advantage over the coil system shown in FIG. 2 resides in an improved signal-to-noise ratio. A drawback consists in that each of the two coil systems 11a . . . 13a, 11b . . . 13b requires a circuit as shown in FIG. 4 plus the downstream analog or digital processing section. This drawback could be avoided by consecutively examining the breasts by means of only one coil system as shown in FIG. 5. However, the examination time would then be longer and, moreover, examinations where use is made of a contrast agents and where the variation in time of the contrast agent enrichment is to be recorded, would almost be impossible.

I claim:

1. A magnetic resonance examination apparatus, comprising a quadrature coil system for MR mammography, characterized in that the quadrature coil system comprises a combination of a hollow cylindrical support for receiving one or both breasts of a mammography patient under examination and having an end face, a first coil system comprising a plurality of coaxial conductor loops which are inductively coupled to one another and which are carried by the cylindrical support in parallel planes, one of said loops being connectable to an input of a receiving device, and a second coil system which is constructed as a surface coil of the butterfly type and which is situated at the end face of the cylindrical support and which can be connected to a further input of the receiving device.

2. A magnetic resonance examination apparatus as claimed in claim 1, wherein the second coil system defines an opening enclosed by outer conductors of the second coil system which is greater than that enclosed by the individual conductor loops of the first coil system.

3. A magnetic resonance examination apparatus as claimed in claim 1, comprising a patient support for a person to be examined, characterized in that the patient support is provided with an opening for accommodating at least a first coil system.

4. A magnetic resonance examination apparatus as claimed in claim 1, comprising a patient support for a person to be examined, characterized in that there is provided a cushion which can be arranged on the table top and in which the two coil systems are integrated.

5. A magnetic resonance examination apparatus as claimed in claim 3, wherein the end face of the cylindrical support is at an end of the cylindrical support which is remote from the patient to be examined.

* * * * *